(12) United States Patent
Siu

(10) Patent No.: US 11,544,033 B2
(45) Date of Patent: Jan. 3, 2023

(54) SPEAKER SYSTEM

(71) Applicant: Lithe Audio LTD, Crawley (GB)

(72) Inventor: Wesley Siu, Crawley (GB)

(73) Assignee: Lithe Audio LTD, Crawley (GB)

( * ) Notice: Subject to any disclaimer, the term of this patent is extended or adjusted under 35 U.S.C. 154(b) by 0 days.

(21) Appl. No.: 17/165,109

(22) Filed: Feb. 2, 2021

(65) Prior Publication Data
US 2021/0247949 A1 Aug. 12, 2021

(30) Foreign Application Priority Data

Feb. 6, 2020 (GB) ..................... 2001651

(51) Int. Cl.
*H04R 3/00* (2006.01)
*G06F 3/16* (2006.01)
*H04L 12/10* (2006.01)
*H04R 1/02* (2006.01)
*H03F 3/20* (2006.01)

(52) U.S. Cl.
CPC ............. *G06F 3/162* (2013.01); *H04L 12/10* (2013.01); *H04R 1/025* (2013.01); *H04R 1/026* (2013.01); *H04R 3/00* (2013.01); *H03F 3/20* (2013.01); *H03F 2200/03* (2013.01); *H04R 2201/021* (2013.01); *H04R 2201/028* (2013.01)

(58) Field of Classification Search
CPC ....... H04L 12/10; G06F 1/3203; G06F 1/263; G06F 3/162; H04R 1/025; H04R 1/026; H04R 2201/021; H04R 2201/028
USPC ...................... 381/58–59, 332, 111
See application file for complete search history.

(56) References Cited

U.S. PATENT DOCUMENTS

| | | | |
|---|---|---|---|
| 9,391,517 B1 * | 7/2016 | Pazhayaveetil | ....... H02M 3/156 |
| 9,774,966 B1 | 9/2017 | Bundy et al. | |
| 9,883,046 B1 | 1/2018 | Labosco et al. | |
| 2007/0274322 A1 | 11/2007 | Hansalia | |
| 2015/0237424 A1 | 8/2015 | Wilker et al. | |
| 2017/0078810 A1 | 3/2017 | Lee et al. | |

(Continued)

FOREIGN PATENT DOCUMENTS

| | | |
|---|---|---|
| CN | 205213025 U | 5/2016 |
| WO | 2017019903 A1 | 2/2017 |

OTHER PUBLICATIONS

EP Application 21154946.4-1216 Extended European Search Report dated May 21, 2021, 9 pages.

(Continued)

*Primary Examiner* — George C Monikang
(74) *Attorney, Agent, or Firm* — Leber IP Law; David C. Robertson

(57) ABSTRACT

A fixed speaker system comprising a speaker housing mountable in or to a ceiling, wall or floor; at least one speaker for outputting audio content, wherein each speaker comprises at least one speaker input and at least one speaker output; a processor configured to receive the or each speaker input and generate the or each speaker output; an amplifier coupled to the processor and configured to drive the speaker; a DC power input configured for direct electrical coupling with a mains power source; a power-over-ethernet (POE) interface module, comprising an interface housing that is removably connected to the speaker housing, wherein the module is configured to input power from a POE source to the DC power input.

20 Claims, 3 Drawing Sheets

(56) References Cited

U.S. PATENT DOCUMENTS

| | | |
|---|---|---|
| 2017/0214224 A1 | 7/2017 | Wickett et al. |
| 2018/0077391 A1 | 3/2018 | Siminoff et al. |
| 2018/0310082 A1* | 10/2018 | Amae ................. B29C 45/1671 |
| 2019/0319999 A1 | 10/2019 | Davison et al. |
| 2020/0142464 A1 | 5/2020 | Ekanayake et al. |

OTHER PUBLICATIONS

GB Application 2001651.5, Search Report dated Jun. 17, 2020, 4 pages.

* cited by examiner

SPEAKER SYSTEM

CROSS-REFERENCE TO RELATED APPLICATIONS

This application claims the benefit of United Kingdom Patent Application No. 2001651.5, filed Feb. 6, 2020, which is herein incorporated by reference in its entirety.

FIELD OF INVENTION

The present invention relates to an improved speaker system. The present invention relates to an audio device mounted in the ceiling, wall, or floor of a building, such as a home, office, hotel, retail or industrial space.

DESCRIPTION OF RELATED ART

"Smart" speakers or "intelligent speaker systems" are a known type of speaker containing a built-in amplifier and control means, such as voice-control, or can be controlled using a Bluetooth® or Wi-Fi device. A user can then play audio content by accessing local storage on a computing device or downloading content from the Internet. The speakers can be mounted in the ceiling, wall, or floor and can communicate with a television, PC or portable computing device, such as a tablet, smartphone, notebook, smartwatch to stream audio content to the speaker for audio output. Known speakers of this type include the Alexa® or Google Home® speakers.

In domestic settings, it is desirable for a user to mount multiple speakers throughout the home for continuous audio output as they move around from room to room. However, this also requires a user to be able to conveniently, safely and efficiently mount multiple devices. The requirements to mount multiple speakers will depend on power connections available in the area in which the speaker is to be mounted. Retrofitting of multiple speakers in existing buildings can require significant work in modifying power connections, which increases the cost and complexity of installation.

SUMMARY OF INVENTION

The present invention sets out to provide an improved speaker system, which addresses the above-described problems.

In one aspect, the invention provides a fixed speaker system comprising a speaker housing mountable in or to a ceiling, wall or floor, and at least one speaker for outputting audio content, wherein each speaker comprises at least one speaker input and at least one speaker output, a processor configured to receive the or each speaker input and generate the or each speaker output, an amplifier coupled to the processor and configured to drive the speaker, a DC power input configured for direct electrical coupling with a mains power source, and a power-over-ethernet (POE) interface module, comprising an interface housing that is removably connected to the speaker housing, wherein the module is to input power from a POE source to the DC power input.

The present invention provides a system that is more convenient to install and allows an installer the option to select the power source at the point of installation depending on whether PoE or mains power is available at the particular installation site, whether that is in the ceiling, a wall or floor. The same sound quality and aesthetic appearance can be achieved regardless of the power source. This is a significant improvement because prior art devices would require the installer to plan whether to install PoE or mains power. The present invention solves the problem of how to conveniently and quickly retrofit mounted speakers without requiring connection to a separate amplifier or requiring an installer to run power cables through walls/ceilings. Furthermore, the present invention allows for the option of the input of DC power and high-speed data using the same POE connection. The present invention offers an innovative solution where PoE is providing as a fully self-contained "bolt-on" module. If POE is not the preferred power source, the DC-powered speaker system remains intact, such that the speaker system is modular and adaptable depending on user requirements. The ease of installation, whilst ensuring high quality audio performance is a significant improvement in this field.

Preferably, the housing of the power over ethernet (POE) interface module, is removably connected to the speaker housing by a "clip-fit" connection.

It is understood that in the context of the present invention "clip-fit" is understood to refer to a resilient interconnection between the POE module and the speaker; that is, the base perimeter of the POE module is sized to interconnect with a mating recess in the speaker. Preferably, the mating recess is within the rear cover of the speaker.

Preferably, the POE interface module comprises an interface controller, which comprises a switching regulator controller.

Preferably, the POE interface module supports a maximum power output of between about 65 W and about 75 W; more preferably, between about 67 W and about 73 W; most preferably, the POE module supports a maximum power output of about 71.3 W. Optionally, the POE module supports a maximum power output of about 90 W.

Preferably, the frequency output of the speaker is between about 55 Hz and about 20 kHz.

Preferably, the POE interface module supports both forward and flyback power topologies.

The POE interface module having a controller with two control modules: forward and flyback, which is a significant improvement to the efficiency of the speaker system. The flyback topology does not require inductors, which helps reduce the size and cost of the system, whilst ensuring the system remains highly efficient.

Preferably, the POE interface module comprises a controllable rectifier bridge.

Preferably, the POE interface module comprises a secondary synchronous rectifier circuit.

More preferably, the POE interface module comprises a controllable rectifier bridge and a secondary synchronous rectifier circuit.

The efficiency of the speaker system; particularly with respect to a significant reduction in heat generation is much improved with the configuration of the POE interface module.

Preferably, the POE interface module comprises an on-chip detector for detecting circuit resistance.

Preferably, the POE interface module comprises a primary overcurrent detection resistor.

The speaker system of the present invention ensures that the output of the POE interface module is stopped when the POE output voltage is shorted or overloaded. Thus, the POE interface module and its power supply equipment are protected. Furthermore, the POE interface module is configured to recover the output independently once the short circuit problem is no longer present.

Preferably, the POE interface module comprises a thermal protector.

Preferably, the POE interface module comprises a detector for detecting when the temperature of the module is above a pre-determined threshold.

More preferably, the thermal protector is activated in response to detection of the temperature of the module being above a pre-determined threshold.

The powered device of the present invention can withstand any applied voltage between 0V and 57V indefinitely. The power dissipation in the POE module of the present invention may be as high as 1.5 W and the device is configured so that the POE module can easily tolerate this power and will only overheat if this condition persists abnormally. By providing a detector for detecting when the temperature of the module is above a pre-determined threshold and activating a thermal protector when the temperature is detected to be too high, the present invention ensures that the device is protected from momentary overload conditions. If the junction temperature exceeds the overtemperature threshold, the POE interface module will stop working to protect the speaker system.

Preferably, the PoE interface module comprises current slope compensation.

The POE interface module is configured to ensure that current loop stability when the duty cycle is greater than or equal to 50%. The slope compensation of the POE interface module does not reduce the maximum peak current at higher duty cycles.

Preferably, the POE interface module is configured to start with input of a reduced current.

The POE interface module comprises a "soft-start" function, such that the module does not require a large current when starting up, which could potentially damage the power supply equipment of the POE interface module. If the previously-described thermal protector is activated in response to detection of the temperature of the module being above a pre-determined threshold, then on re-starting when temperature is restored to below the pre-determined threshold, the "soft start" function will also be initiated.

Preferably, the processor is configured to process data received from a mobile computing device.

Preferably, the processor comprises a removable microcontroller (MCU).

By providing a removable MCU or "media module", the life span of the speaker system is greatly improved because the system can be conveniently updated with any additional features incorporated into an updated device. Thus, the environmental impact of the speaker system is reduced by ensuring that the speaker system can be updated.

Preferably, the height of the speaker housing is between about 100 mm and about 120 mm; more preferably, the height of the speaker housing is between about 105 mm and about 110 mm; most preferably, the height of the speaker housing is about 107 mm.

Preferably, the speaker housing is substantially cylindrical; more preferably, the diameter of the substantially cylindrical speaker housing is between about 200 mm and about 240 mm; more preferably, the diameter of the substantially cylindrical speaker housing is between about 210 mm and about 230 mm.

Preferably, the height of the POE interface module is between about 30 mm and about 40 mm; more preferably, the height of the POE module is between about 33 mm and 37 mm; most preferably, the height of the POE module is about 35 mm.

Preferably, the POE interface module is substantially cylindrical; more preferably, the diameter of the substantially cylindrical POE interface module is between about 100 mm and about 120 mm; more preferably, the diameter of the substantially cylindrical POE interface module is about 112 mm.

The present invention is an intelligent speaker system that can communicate with a television, PC, or portable computing device, such as a tablet, smartphone, notebook, smartwatch; for example, by Bluetooth®, AirPlay® etc.

For the purposes of clarity and a concise description, features are described herein as part of the same or separate embodiments; however, it will be appreciated that the scope of the invention may include embodiments having combinations of all or some of the features described.

BRIEF DESCRIPTION OF THE DRAWINGS

The invention will now be described by way of example with reference to the accompanying drawings, in which:—

DETAILED DESCRIPTION

Figure 1:
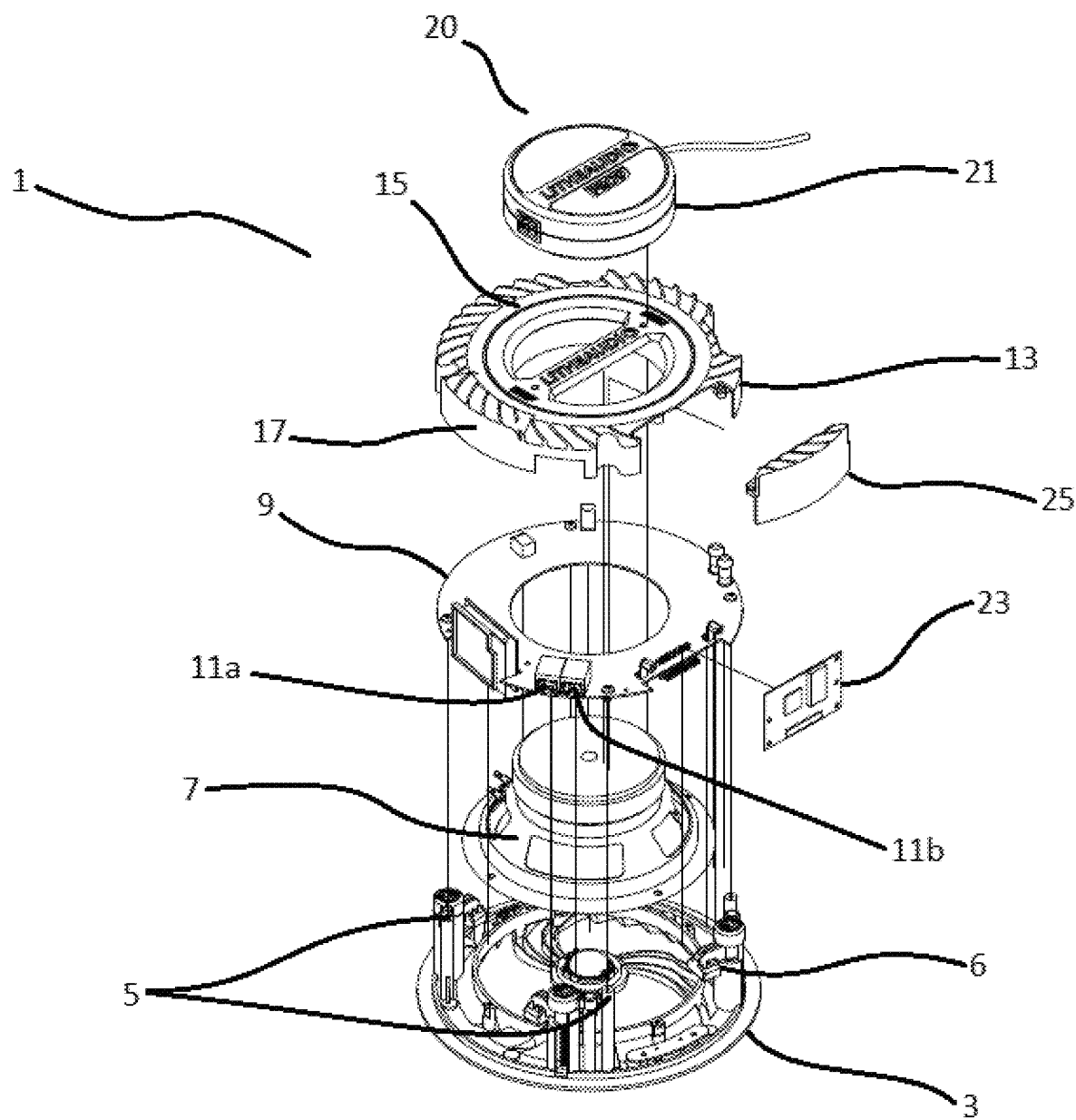
FIG. 1 is a perspective exploded view of a speaker system according to the present invention.

Referring to FIG. 1, the speaker system 1 comprises a front fascia 3, which comprises three fins. In use the front fascia 3 and fins are covered by a grill (not shown), which allows the speaker system to blend into the surface to which it is fitted; for example a white grill can be used when the speaker system 1 is fitted to a white ceiling. The front fascia 3 faces outward into a room when the speaker system 1 is mounted into a recess in a ceiling, wall or to the floor. The front fascia 3 comprises fixings 5 to connect the front fascia 3 to other components of the speaker system 1 and comprises rotatable clamps 6, which are used to hold the speaker into a recess in a ceiling.

The speaker system 1 further comprises a speaker cone 7. By way of example the speaker system 1 of the present invention is configured to deliver high quality audio output in the range of 55 Hz-20 kHz. The speaker cone 7 is connected to the front fascia 3 at a first end and to the main printed circuit board assembly 9 (PCBA) at a second end. The PCBA 9 comprises fixings to secure the PCBA 9 to the front fascia 3, and the electronic components of the PCBA 9 are described in more detail with respect to FIG. 2.

Referring to FIG. 1, the speaker system 1 comprises an ethernet input and output port 11a, 11b to be connected directly to a router or via an ethernet switch. In use, the separate ethernet input and output ports 11a, 11b allows multiple speaker system devices 1 to be connected by a "daisy chain" without requiring each speaker system 1 to be directly connected to the router or via an ethernet switch, such that cabling requirements are reduced. The speaker system 1 further comprises a rear cover 13 having a substantially circular end face 15 and upstanding side walls 17. In use, with the rear cover 13 fixed to the other components of the speaker system 1, the side walls 17 protect the internal components. When the rear cover 13 is fixed to the front fascia 3, the housing has a cylindrical shape with a height of about 107 mm without the POE interface module 20 attached and a diameter of between about 210-230 mm.

The speaker system 1 further comprises a removable, power-over-ethernet (POE) interface module 20, which is removably mountable to a recess in the rear cover 17. The POE interface module 20 comprises a cylindrical housing 21 having a height of about 35 mm and a diameter of about 112 mm. In use, the POE interface module 20, is removably connected by a "clip-fit" into a recess in the rear cover 17. A user is given a tactile indication that the POE interface module 20 is secure. It is also envisaged that, in alternative embodiments of the present invention, the POE interface module is used without being connected to the rear cover of the speaker system; for example, if there are space constraints at the point of installation, the POE interface module can be positioned adjacent to the other speaker system components because the POE interface module is a fully self-contained component.

The POE interface module is an optional "bolt-on" module enabling power re-distribution from an ethernet power source to the PCBA 9 and speaker amplifier. The POE interface module 20 comprises electrical components to re-distribute the power from a POE injector to the amplifier of the speaker system 1. The POE interface module 20 is connected to the amplifier by a 30 cm DC cable. If the POE interface module 20 is not used, the speaker system and its remaining components are housed as a fully self-contained unit to be connected to mains power, such as to a lighting circuit or plugged in to a socket.

The speaker system 1 of the present invention also comprises a surround sound module 23, which is removably attached to the speaker system 1 if surround sound features are required. The surround sound module 23 is protected, in use, by a side cover 25, which attaches to the rear cover 13, such that the speaker system 1 comprises a continuous cylindrical side wall when the device is ready for installation.

Figure 2:
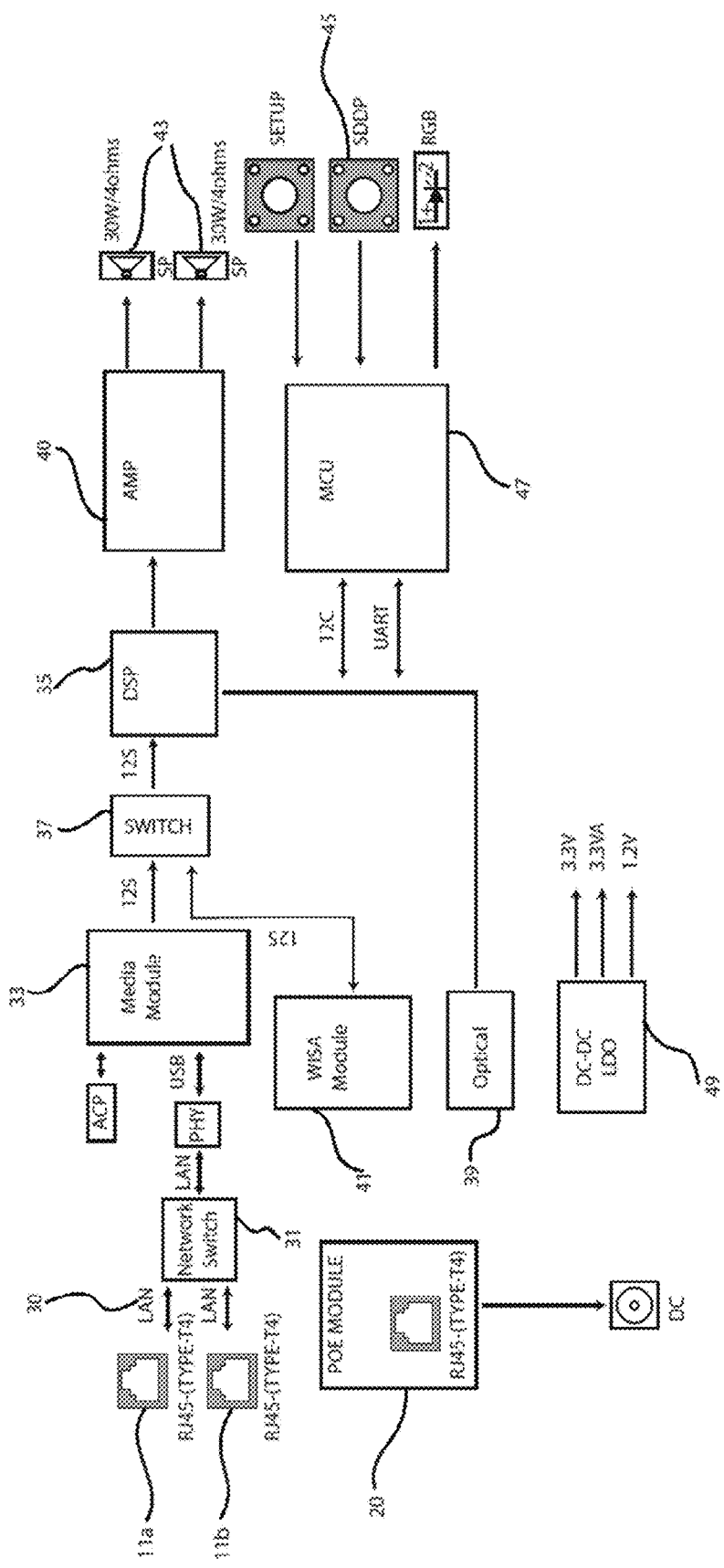
FIG. 2 is a circuit diagram of the components of the speaker system shown in FIG. 1, in accordance with the present invention.

Referring to FIG. 2, the internal components of the speaker system 1 are shown in more detail with the ethernet input and outlet ports 11a, 11b connected by a LAN 30 and a network switch 31 to a media module 33. A digital signal processor chip 35 is connected via a switch 37 to the media module 33, to an optical chip 39 and to the amplifier 40. If a surround sound "bolt on" is used, the switch 37 is connected to a surround sound module 41. The amplifier 40 is connected to the speaker cone 43 to output the audio signals.

The speaker system 1 further comprises a processor 45 to communicate with wired and wireless devices used to input data to the speaker system 1, which is controlled by a micro-controller 47. Data can be provided wirelessly, for example by Bluetooth® connection with a mobile device, such as a smartphone or tablet. The POE interface module 20 is shown as an alternative power source to the DC-DC power converter 49, which is used if the speaker system 1 is connected directly to mains power. The POE interface module is used if power to the speaker system is supplied by an Ethernet connection to an Ethernet port. In the embodiment shown, audio data is supplied by the ethernet input and outlet ports 11a, 11b.

The POE interface module 20 of the present invention is carefully configured to avoid transformed noise that can occur during debugging of the POE input. The compensation resistor is adjusted for current sampling so that transformer noise is eliminated. The appropriate output electrolytic capacitor is selected to reduce the output voltage ripple; to reduce the POE input plus common mode inductance and Y capacitor to suppress common mode interference. Furthermore, to suppress conducted and radiated disturbance, the module comprises a transformed plus shield shell, primary switch and secondary synchronous rectifier tube plus RC absorption circuit.

Figure 3:
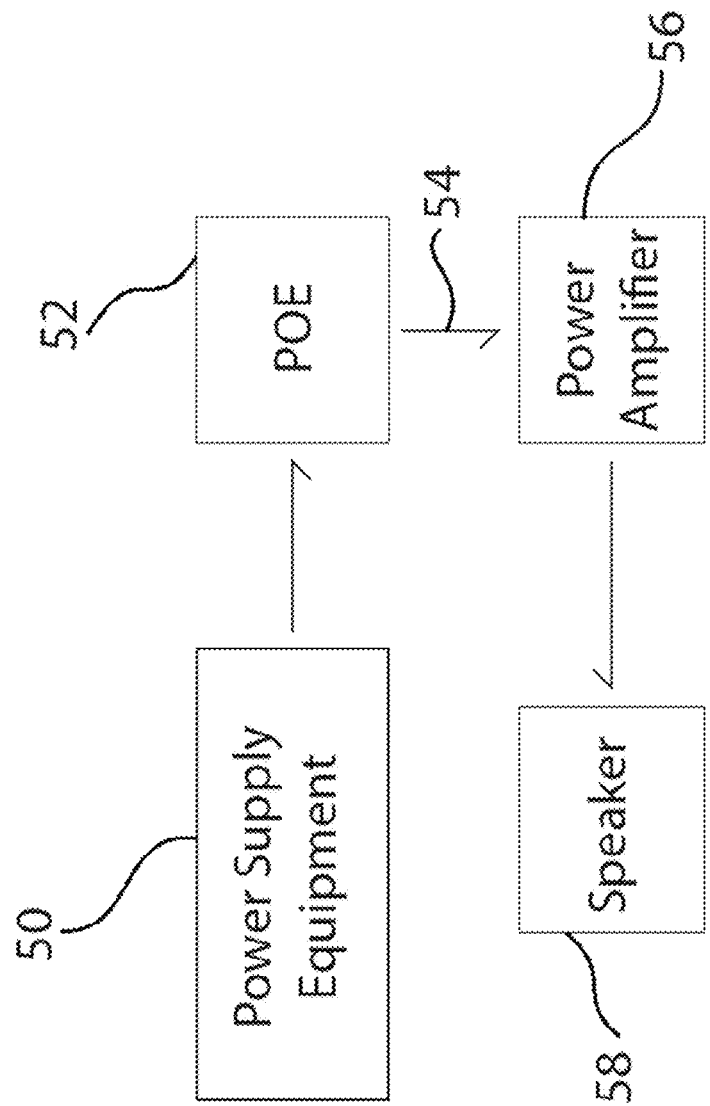
FIG. 3 is a schematic diagram showing connections from a Power Over Ethernet (POE) supply to the speaker system of the present invention.

Referring to FIG. 3, a schematic diagram shows the connections from a Power Over Ethernet (POE) power supply 50 to the POE interface module 52 and then via a DC cable to the power amplifier 56 to drive the speaker 58. The POE interface module 52 supports a maximum output power of about 71.3 W and includes a switching regulator controller. However, in alternative embodiments of the present invention, it is envisaged that the maximum power is 90 W. The POE interface module 52 is connected to the amplifier by a DC cable of length about 30 cm. The frequency output of the speaker is between about 55 Hz and about 20 kHz.

In use, to mount the speaker system 1 to a ceiling, an aperture of the correct dimensions is cut into the ceiling and a user can decide whether the speaker system is to be powered directly from mains power; for example by connection to a power socket or the mains lighting circuit; or if the speaker system is to be powered by connection of the POE interface module 20 to the rear cover 13 of the speaker system 1. Regardless of the power source, the external appearance of the speaker is the same. If POE is to be used, the POE interface module 20 is bolted on with a push fit connection to the speaker system 1. When the speaker is connected, the clamps are moved so that they grip the aperture and the speaker system 1 is held within the ceiling cavity.

Within this specification, the term "about" means plus or minus 20%; more preferably, plus or minus 10%; even more preferably, plus or minus 5%; most preferably, plus or minus 2%.

The above described embodiment has been given by way of example only, and the skilled reader will naturally appreciate that many variations could be made thereto without departing from the scope of the claims.

The invention claimed is:

1. A fixed speaker system comprising;
   a speaker housing mountable in or to a ceiling, wall or floor;
   at least one speaker for outputting audio content, wherein each speaker comprises at least one speaker input and at least one speaker output;
   a processor configured to receive the or each speaker input and generate the or each speaker output;
   an amplifier coupled to the processor and configured to drive the speaker;
   a DC power input configured for direct electrical coupling with a mains power source; and
   a power-over-ethernet (POE) interface module, comprising an interface housing that is removably connected to the speaker housing, wherein the module is configured to input power from a POE source to the DC power input.

2. The fixed speaker system according to claim 1 wherein the housing of the POE interface module is removably connected to the speaker housing by a "clip-fit" connection.

3. The fixed speaker system according to claim 1 wherein the POE interface module comprises an interface controller, the interface controller including a switching regulator controller.

4. The fixed speaker system according to claim 1 wherein the POE interface module supports a maximum power output of about 71.3 W.

5. The fixed speaker system according to claim 1 wherein the frequency output of the speaker is between about 55 Hz and about 20 kHz.

6. The fixed speaker system according to claim 1 wherein the POE interface module supports both forward and flyback power topologies.

7. The fixed speaker system according to claim 1 wherein the POE interface module comprises a controllable rectifier bridge.

8. The fixed speaker system according to claim 1 wherein the POE interface module comprises a secondary synchronous rectifier circuit.

9. The fixed speaker system according to claim 1 wherein the POE interface module comprises a controllable rectifier bridge and a secondary synchronous rectifier circuit.

10. The fixed speaker system according to claim 1 wherein the POE interface module comprises an on-chip detector for detecting circuit resistance.

11. The fixed speaker system according to claim 1 wherein the POE interface module comprises a primary overcurrent detection resistor.

12. The fixed speaker system according to claim 1 wherein the POE interface module comprises a thermal protector.

13. The fixed speaker system according to claim 1 wherein the POE interface module comprises a detector for detecting when the temperature of the module is above a pre-determined threshold.

14. The fixed speaker system according to claim 1 wherein the POE interface module comprises a thermal protector and the thermal protector is activated in response to detection of the temperature of the module being above a pre-determined threshold.

15. The fixed speaker system according to claim 1 wherein the PoE interface module comprises current slope compensation.

16. The fixed speaker system according to claim 1 wherein the POE interface module is configured to start with input of a reduced current.

17. The fixed speaker system according to claim 1 wherein the processor is configured to process data received from a mobile computing device.

18. The fixed speaker system according to claim 1 wherein the processor comprises a removable microcontroller (MCU).

19. The fixed speaker system according to claim 1 wherein:
- the height of the speaker housing is between about 105 mm and about 110 mm; and
- the diameter of the speaker housing is between about 210 mm and about 230 mm.

20. The fixed speaker system according to claim 1 wherein:
- the height of the POE interface module is between about 30 mm and about 40 mm; and
- the diameter of the POE interface module is between about 100 mm and about 120 mm.

* * * * *